(12) United States Patent
Qin et al.

(10) Patent No.: US 9,179,563 B2
(45) Date of Patent: Nov. 3, 2015

(54) ELECTRONIC DEVICE

(71) Applicants: HON HAI PRECISION INDUSTRY CO., LTD., New Taipei (TW); AMBIT MICROSYSTEMS (SHANGHAI) LTD., Shanghai (CN)

(72) Inventors: Dong Qin, Shanghai (CN); Hong-Xia Sheng, Shanghai (CN); Hui Hu, Shanghai (CN)

(73) Assignees: AMBIT MICROSYSTEMS (SHANGHAI) LTD., Shanghai (CN); HON HAI PRECISION INDUSTRY CO., LTD., New Taipei (TW)

( * ) Notice: Subject to any disclaimer, the term of this patent is extended or adjusted under 35 U.S.C. 154(b) by 100 days.

(21) Appl. No.: 14/160,738

(22) Filed: Jan. 22, 2014

(65) Prior Publication Data

US 2014/0211383 A1    Jul. 31, 2014

(30) Foreign Application Priority Data

Jan. 31, 2013    (CN) .......................... 2013 2 0054959

(51) Int. Cl.
*H05K 5/00* (2006.01)
*H05K 5/02* (2006.01)
*H01Q 1/12* (2006.01)

(52) U.S. Cl.
CPC ........... *H05K 5/0247* (2013.01); *H01Q 1/1214* (2013.01)

(58) Field of Classification Search
CPC combination set(s) only.
See application file for complete search history.

(56) References Cited

U.S. PATENT DOCUMENTS

| 2,965,340 | A  | * | 12/1960 | Chadowski | 248/539 |
| 6,140,971 | A  | * | 10/2000 | Kitamura | 343/702 |
| 7,422,189 | B2 | * | 9/2008 | Militz et al. | 248/539 |
| 7,532,167 | B2 | * | 5/2009 | Liang et al. | 343/702 |
| 7,825,872 | B2 | * | 11/2010 | Guo | 343/880 |
| 2011/0080697 | A1 | * | 4/2011 | Ishikawa | 361/679.01 |
| 2014/0022129 | A1 | * | 1/2014 | Yoon | 343/713 |

* cited by examiner

*Primary Examiner* — Lisa Lea Edmonds
(74) *Attorney, Agent, or Firm* — Novak Druce Connolly Bove + Quigg LLP

(57) ABSTRACT

An electronic device includes a case and a connector. The case includes a first sidewall, a second sidewall perpendicularly connected to the first sidewall, and a pair of latching protrusions. A through hole is defined in the first sidewall. The pair of latching protrusions is located on the two opposite sides of the through hole and perpendicular extended from the second sidewall. Each of the latching protrusions comprises a first side near to the through hole and a second side away from the through hole. The connector is inserted in the case. The connector includes a shaft portion and a flange radially extending from the shaft portion. The shaft portion is inserted into the through hole. Thus, securing the connector from falling.

8 Claims, 7 Drawing Sheets

ELECTRONIC DEVICE

BACKGROUND

1. Technical Field

The disclosure generally relates to fastening structures, and more particularly, to an electronic device including a fastening structure to fix a connector.

2. Description of Related Art

An antenna is assembled to an electronic device using a connector fastened on an inner sidewall of the electronic device. However, the electronic device has no fastening structure to secure the connectors. Thus, the connector may easily fall from the connection terminal and inside the electronic device, which leads to a low assembly efficiency case.

Therefore, it is desirable to provide a means which can overcome the above-mentioned problems.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Figure 1:
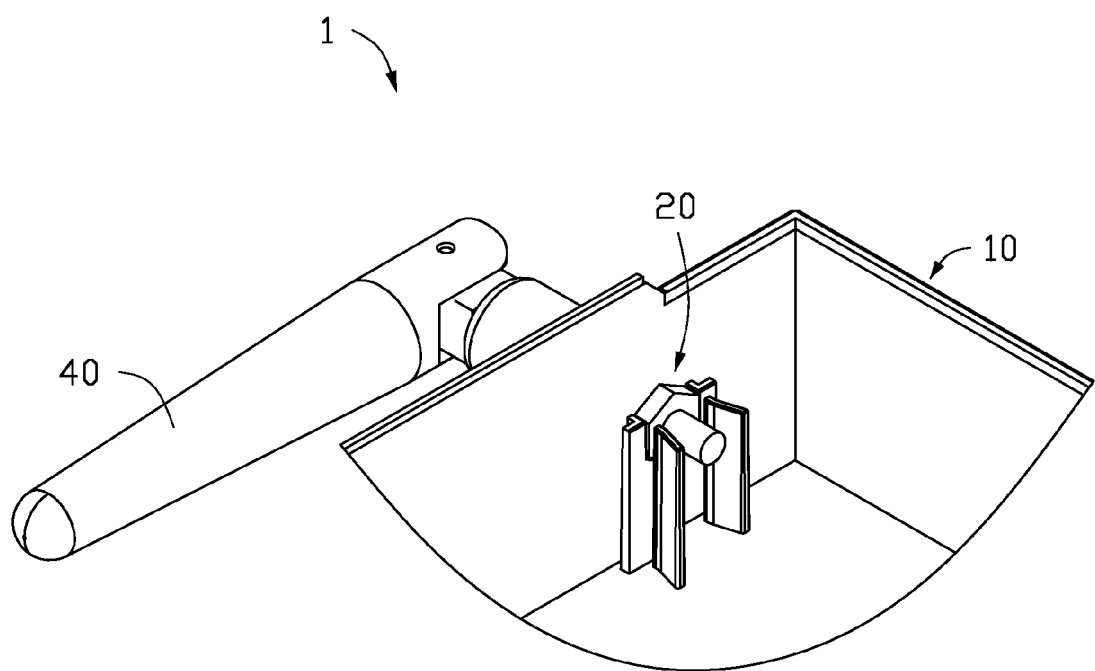
FIG. 1 is a schematic, isometric view of an embodiment of an electronic device.
Figure 2:
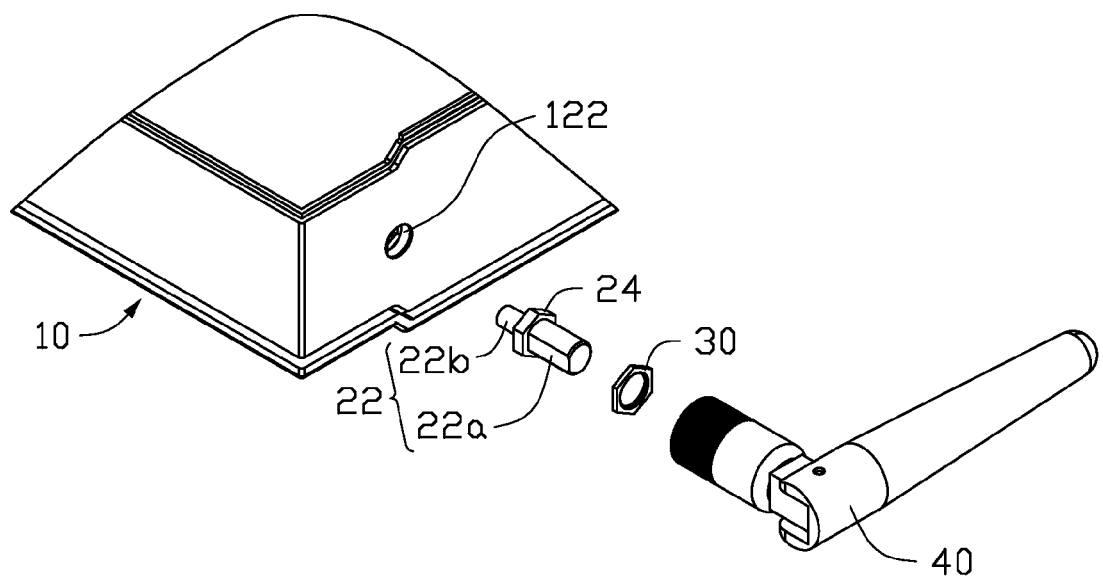
FIG. 2 is an exploded, isometric view of the electronic device of FIG. 1 but shown in another aspect.
Figure 3:
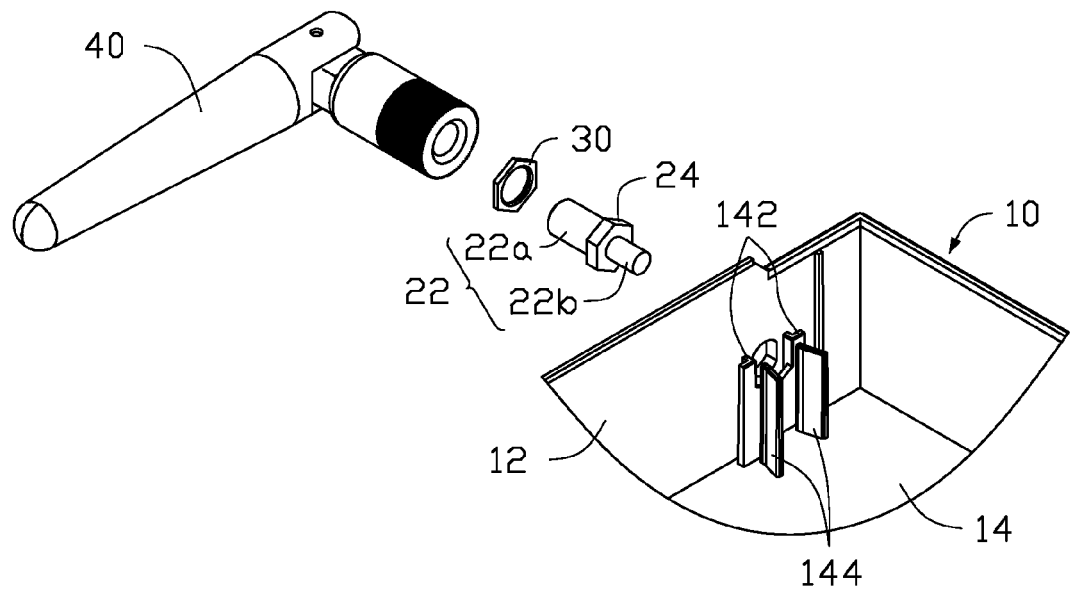
FIG. 3 is an exploded, isometric view of the electronic device of FIG. 1.
Figure 4:
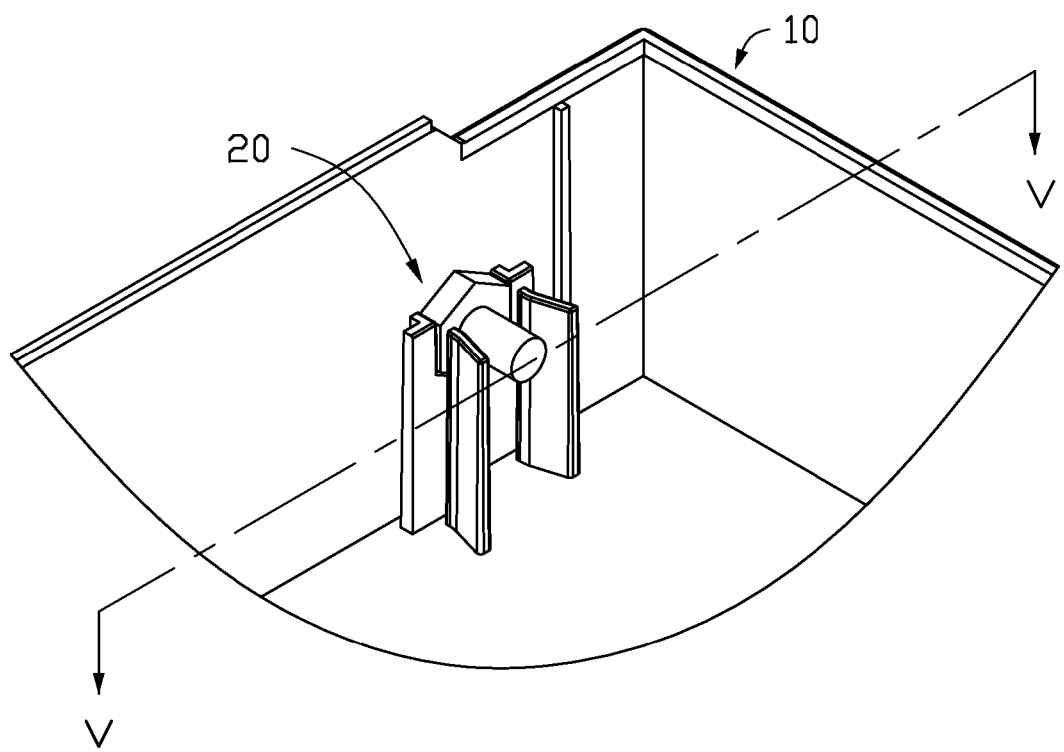
FIG. 4 is an assembled, isometric view of the electronic device, the electronic device including a connector inserted in a case.
Figure 5:
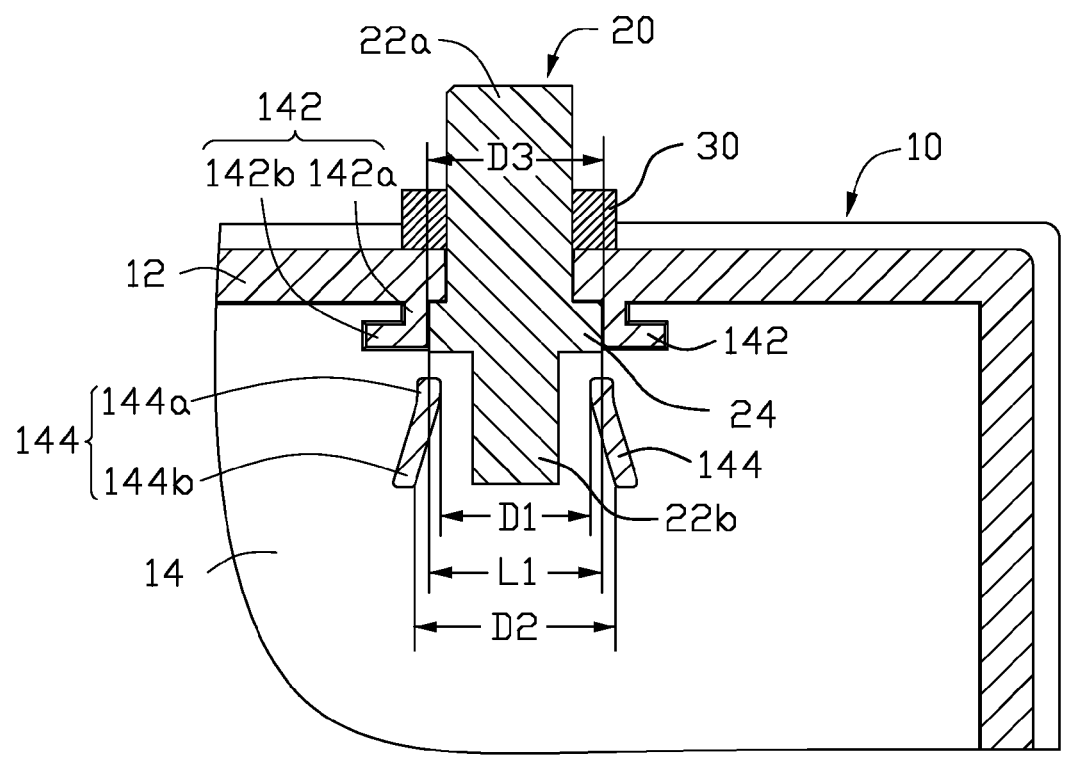
FIG. 5 is a cross-sectional view of the electronic device taken along line V-V of FIG. 4.

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

FIGS. 1 to 5 show an embodiment of an electronic device 1. The electronic device 1 includes a case 10, a connector 20, a nut 30, and an antenna 40 for transmitting and receiving signals. The connector 20 connects the antenna 40 with the electronic device 1. The nut 30 fastens the connector 20 to the electronic device 1.

The case 10 includes a first sidewall 12, a second sidewall 14, a pair of positioning protrusions 142 and a pair of latching protrusions 144. The second sidewall 14 is connected substantially perpendicularly to the first sidewall 12. A through hole 122 is defined in the first sidewall 12 to receive the connector 200.

The pair of positioning protrusions 142 is located on the two opposite sides of the through hole 122 on the first sidewall 12. Each of the positioning protrusions 142 includes a connecting portion 142a and an extending portion 142b. The connecting portions 142a extend from an inner surface of the first sidewall 12. The extending portions 142b extend from a distal end of each connecting portion 142a along two opposite directions substantially perpendicular to the connecting portions 142a.

The pair of latching protrusions 144 extends substantially perpendicularly from the second sidewall 14 aligned towards the pair of positioning protrusions 142. The latching protrusions 144 can be substantially rectangular. Each of the latching protrusions 144 includes a first side 144a near the through hole 122 and a second side 144b away from the through hole 122. The distance between the pair of latching protrusions 144 gradually increases from the first sides 144a to the second sides 144b. The pair of the latching protrusions 144 are each curved towards opposite directions. The latching protrusions 144 are made of a resilient material and deformable if an external force is manually applied.

The connector 20 includes a shaft portion 22 and a flange 24 extending radially from a middle part of the shaft portion 22. The shaft portion 22 includes a first part 22a and a second part 22b at two opposite sides of the flange 24. A radial length L1 of the flange 24 is greater than a first distance D1 between the two first sides 144a of the pair of the latching protrusions 144, but is less than a second distance D2 between the two second sides 144b of the pair of the latching protrusions 144. Moreover, the radial length L1 of the flange 24 is less than a third distance D3 between the two connecting portions 142a of the positioning protrusions 142.

In assembly, the first part 22a of the connector 20 extends out of the case 10 through the through hole 122. The nut 30 is sleeved on the first part 22a from outside of the case 10 to fasten the connector 20 to the first sidewall 12. The antenna 40 is connected to the first part 22a of the shaft portion 22.

Figure 6:
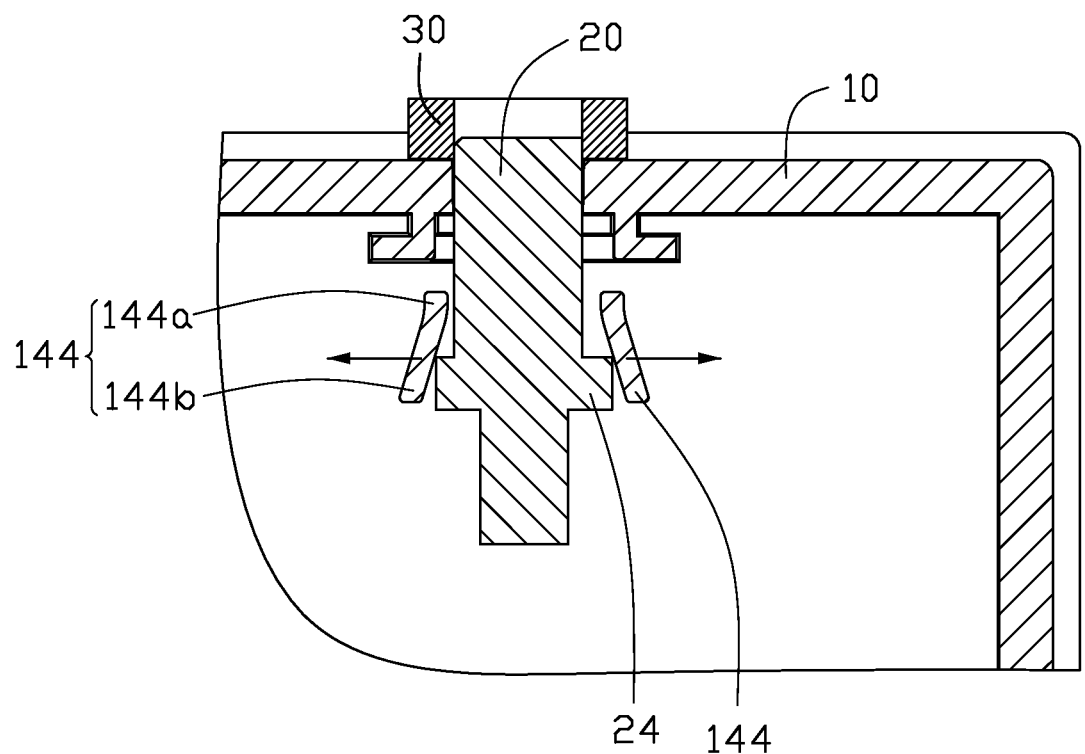
FIG. 6 is similar to FIG. 5, with the connector inserted into the case from a wide side of a pair of latching protrusions.

FIG. 6 shows that when the connector 20 is inserted into the through hole 122 from the second sides 144b to the first sides 144a, the first sides 144a resiliently deform to allow the flange 24 to pass through a gap between the first sides 144a. The latching protrusions 144 restore to their original shape to prevent the connector 20 from passing back through the gap between the first sides 144a. The flange 24 is positioned between the pair of positioning protrusions 142 when the connector 20 is fastened to the first sidewall 12 by the nut 30 screwing on the first part 22 of the shaft portion 22.

Figure 7:
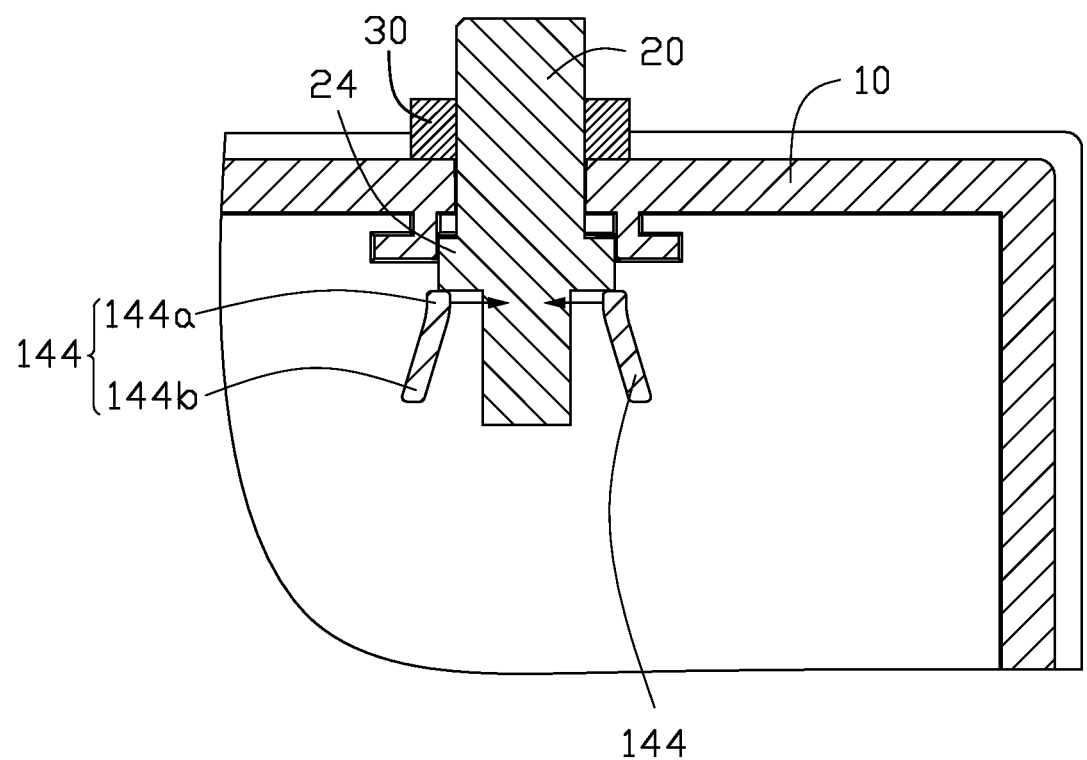
FIG. 7 is similar to FIG. 5, but with the connector moved towards a narrow side of the pair of latching protrusions.

FIG. 7 shows that when the connector 20 is moving towards the first sides 144a of the latching protrusions 144, because of the first distance D1 is narrower than the radial length L1, the latching protrusions 144 will stop the connector 20. Moreover, the flange 24 will shorten the first distance D1 by pushing the first sides 144a of latching protrusions 144, thus stopping the flange 24 from falling inside the case 10.

The latching protrusions 144 fix the connector 20 on the case 10. In addition, the flange 24 of the connector 20 is fixed between the latching protrusions 144 and the first sidewall 12, securing the connector 20 from falling inside the case 10. Even if the antenna 40 and the nut 30 are unscrewed from the connector 20, the connector 20 will not fall inside the case 10.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An electronic device comprising a case and a connector, wherein the case comprises a first sidewall, a second sidewall connected substantially perpendicularly to the first sidewall, a pair of latching protrusions, and a through hole defined in the first sidewall, the pair of latching protrusions is located on two opposite sides of the through hole and extend substantially perpendicularly from the second sidewall, the latching protrusions are made of resilient material, each of the latching protrusions comprises a first side near to the through hole and a second side away from the through hole; the connector comprises a shaft portion and a flange extending radially from the shaft portion, the shaft portion is inserted into the through hole, the flange is fixed between the latching protrusions and the first sidewall, and a radial length of the flange is greater than a distance between the two first sides of the latching protrusions, but is less than a distance between the two second sides of the latching protrusions.

2. The electronic device of claim 1, wherein the latching protrusions are each curved towards opposite directions.

3. The electronic device of claim 1, wherein the latching protrusions are substantially rectangular.

4. The electronic device of claim 1, wherein the case further comprises a pair of positioning protrusions located on the two opposite side of the through hole on the first sidewall.

5. The electronic device of claim 4, wherein each of the positioning protrusions comprises a connecting portion and a extending portion, the connecting portions extend from the inner surface of the first sidewall, the extending portions extend from a distal end of each connecting portion along two opposite directions substantially perpendicular to the connecting portions.

6. The electronic device of claim 5, wherein the radial length of the flange is less than a distance between the two connecting portions.

7. The electronic device of claim 1, wherein the electronic device further comprises a nut, the shaft portion comprises a first part and a second part at two opposite sides of the flange, the first part extends out of the case by passing through the through hole, and the nut is sleeved on the first part from outside of the case to fasten the connector to the first sidewall.

8. The electronic device of claim 7, wherein the electronic device further comprises an antenna for transmitting and receiving signals, and the antenna is connected to the first part of the shaft portion.

* * * * *